(12) United States Patent  (10) Patent No.: US 12,411,532 B2
He  (45) Date of Patent: Sep. 9, 2025

(54) FAN APPARATUS FOR AN INFORMATION HANDLING SYSTEM

(71) Applicant: Dell Products L.P., Round Rock, TX (US)

(72) Inventor: Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 215 days.

(21) Appl. No.: 18/455,709

(22) Filed: Aug. 25, 2023

(65) Prior Publication Data

US 2025/0068217 A1  Feb. 27, 2025

(51) Int. Cl.
*G06F 1/20* (2006.01)
*H05K 7/20* (2006.01)

(52) U.S. Cl.
CPC ........... *G06F 1/20* (2013.01); *H05K 7/20172* (2013.01)

(58) Field of Classification Search
CPC .... F04D 29/281; F04D 25/0613; F04D 29/30; F04D 17/025; F04D 29/325; F04D 29/326; F04D 29/329; F04D 29/4226; F04D 19/002; F04D 25/064; F04D 25/08; F04D 29/164; F04D 29/263; F04D 29/34; F04D 29/38; H05K 7/20172; H05K 7/20145; G06F 1/20; G06F 2200/201; F05D 2240/304; F01D 5/147; F01D 5/225
See application file for complete search history.

(56) References Cited

U.S. PATENT DOCUMENTS

| | | | | |
|---|---|---|---|---|
| 5,423,660 A | * | 6/1995 | Sortor | F04D 29/164 416/247 R |
| 5,489,186 A | * | 2/1996 | Yapp | F01D 5/141 415/58.7 |
| 6,508,624 B2 | * | 1/2003 | Nadeau | F01D 11/08 415/173.6 |
| 9,909,485 B2 | * | 3/2018 | Hong | F04D 29/164 |
| 11,959,489 B2 | * | 4/2024 | Cote | F04D 29/384 |
| 2007/0098571 A1 | * | 5/2007 | Nagamatsu | F04D 29/281 417/354 |
| 2007/0224044 A1 | * | 9/2007 | Hong | F04D 29/547 415/211.2 |
| 2009/0060730 A1 | * | 3/2009 | Hwang | F04D 29/30 415/203 |
| 2010/0149753 A1 | * | 6/2010 | Lin | H05K 7/20172 361/695 |
| 2012/0301277 A1 | * | 11/2012 | Chang | F04D 29/051 415/119 |
| 2020/0003222 A1 | * | 1/2020 | Kennedy | F04D 29/023 |
| 2020/0173336 A1 | * | 6/2020 | Hong | B60K 11/00 |
| 2022/0025899 A1 | * | 1/2022 | Hong | F04D 29/526 |

(Continued)

*Primary Examiner* — Michael A Matey

(74) *Attorney, Agent, or Firm* — McDermott Will & Schulte LLP

(57) ABSTRACT

A fan apparatus for an information handling system, including a fan having a first side and a second side, the second side positioned opposite to the first side, the fan including: a shaft; a plurality of blades coupled to the shaft; and a rib coupled to one or more of the plurality of blades at the first side of the fan; a fan housing, including: an opening; and an emboss surrounding the opening; wherein the fan is coupled to the fan housing with the first side of the fan in superimposition with the opening of the fan housing such that the rib of the fan is positioned within the emboss of the fan housing.

20 Claims, 9 Drawing Sheets

(56) References Cited

U.S. PATENT DOCUMENTS

| | | | |
|---|---|---|---|
| 2022/0136520 A1* | 5/2022 | He | F04D 29/327 |
| | | | 416/175 |
| 2023/0228279 A1* | 7/2023 | Cote | F04D 29/023 |
| | | | 416/189 |
| 2024/0426317 A1* | 12/2024 | He | F04D 29/4226 |

* cited by examiner

FAN APPARATUS FOR AN INFORMATION HANDLING SYSTEM

BACKGROUND

Field of the Disclosure

The disclosure relates generally to fan apparatus for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a fan apparatus for an information handling system, including a fan having a first side and a second side, the second side positioned opposite to the first side, the fan including: a shaft; a plurality of blades coupled to the shaft; and a rib coupled to one or more of the plurality of blades at the first side of the fan; a fan housing, including: an opening; and an emboss surrounding the opening; wherein the fan is coupled to the fan housing with the first side of the fan in superimposition with the opening of the fan housing such that the rib of the fan is positioned within the emboss of the fan housing.

Other embodiments of these aspects include corresponding systems and apparatus.

These and other embodiments may each optionally include one or more of the following features. For instance, the opening is circular. The emboss is circular. The rib is circular. The emboss includes a first wall spaced-apart from a second wall, wherein the rib is positioned within the emboss such that the rib is spaced-apart from the first wall and the second wall. The emboss further includes a surface positioned between the first wall and the second wall, wherein the rib is positioned within the emboss such that the rib is spaced-apart from the surface. The fan further includes an additional rib coupled to each of the plurality of blades at the first side of the fan, the fan housing further includes an additional emboss surrounding the opening, the fan is coupled to the fan housing with the first side of the fan in superimposition with the opening of the fan housing such that the additional rib of the fan is positioned within the additional emboss of the fan housing. The emboss surrounds the additional emboss. The fan further includes an additional rib coupled to each of the plurality of blades at the second side of the fan, the fan housing having a first side and a second side, the second side positioned opposite to the first side, the fan housing further including an additional opening positioned on the second side and an additional emboss surrounding the additional opening, the fan is coupled to the fan housing with the second side of the fan in superimposition with the additional opening of the fan housing such that the additional rib of the fan is positioned within the additional emboss of the fan housing. The opening of the fan housing is positioned on the first side of the fan housing.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
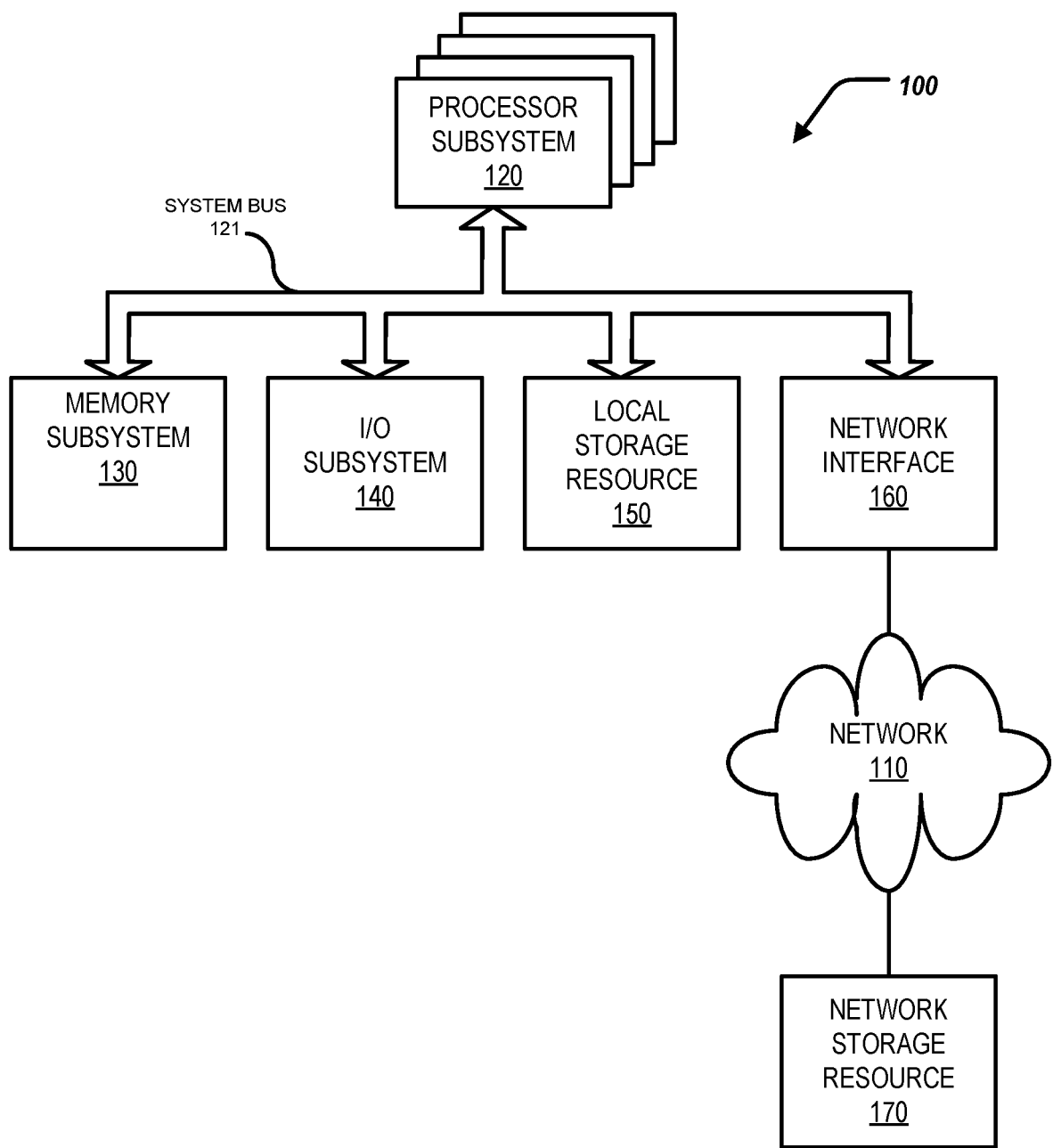
FIG. 1 is a block diagram of selected elements of an embodiment of an information handling system.

This disclosure discusses a fan apparatus of an information handling system. In short, an air gap is maintained between a fan and a fan housing to account for several factors that could drive fan blades of the fan to come into contact with the fan housing—wobble of the fan blades, mechanical tolerance in dimensions of the fan blades, and fan housing deformation. However, such an air cap can create an air flow path for recirculation of air back to the fan.

Specifically, this disclosure discusses a fan apparatus for an information handling system, including: a fan having a first side and a second side, the second side positioned opposite to the first side, the fan including: a shaft; a plurality of blades coupled to the shaft; and a rib coupled to each of the plurality of blades at the first side of the fan; a fan housing, including: an opening; and an emboss surrounding the opening; wherein the fan is coupled to the fan housing with the first side of the fan in superimposition with the opening of the fan housing such that the rib of the fan is positioned within the emboss of the fan housing.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory. EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
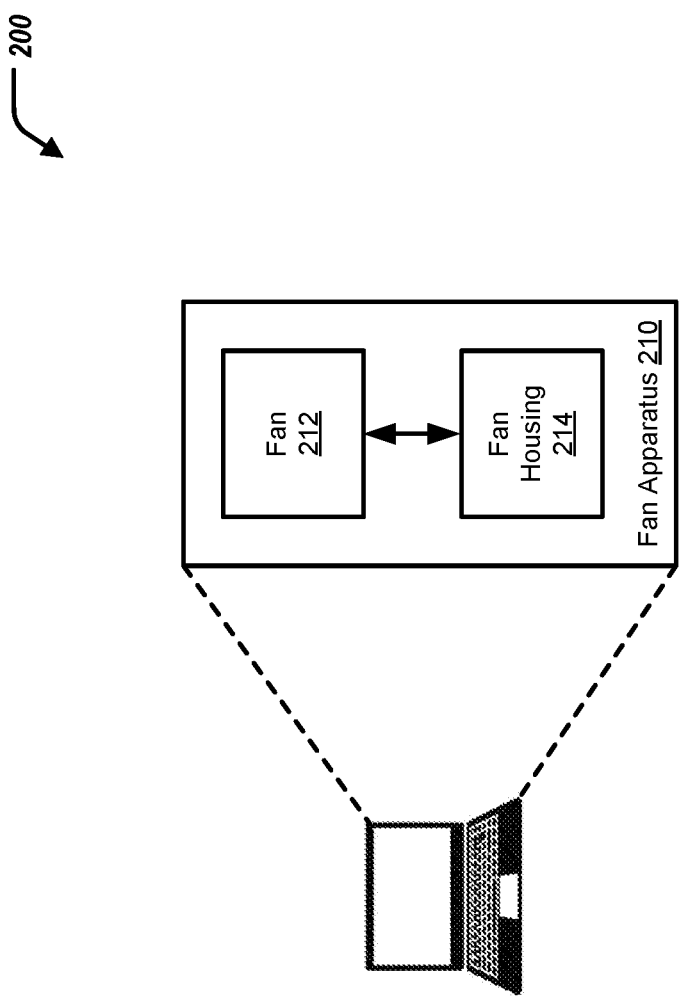
FIG. 2 illustrates a block diagram of an information handling system including a fan apparatus.

Turning to FIG. 2, FIG. 2 illustrates an environment 200 including an information handling system 202. The information handling system 202 can include a fan apparatus 210. The fan apparatus 210 can include a fan 212 and a fan housing 214. In some examples, the information handling system 202 is similar to, or includes, the information handling system 100 of FIG. 1. The fan 212 can be coupled to the fan housing 214.

Figure 3:
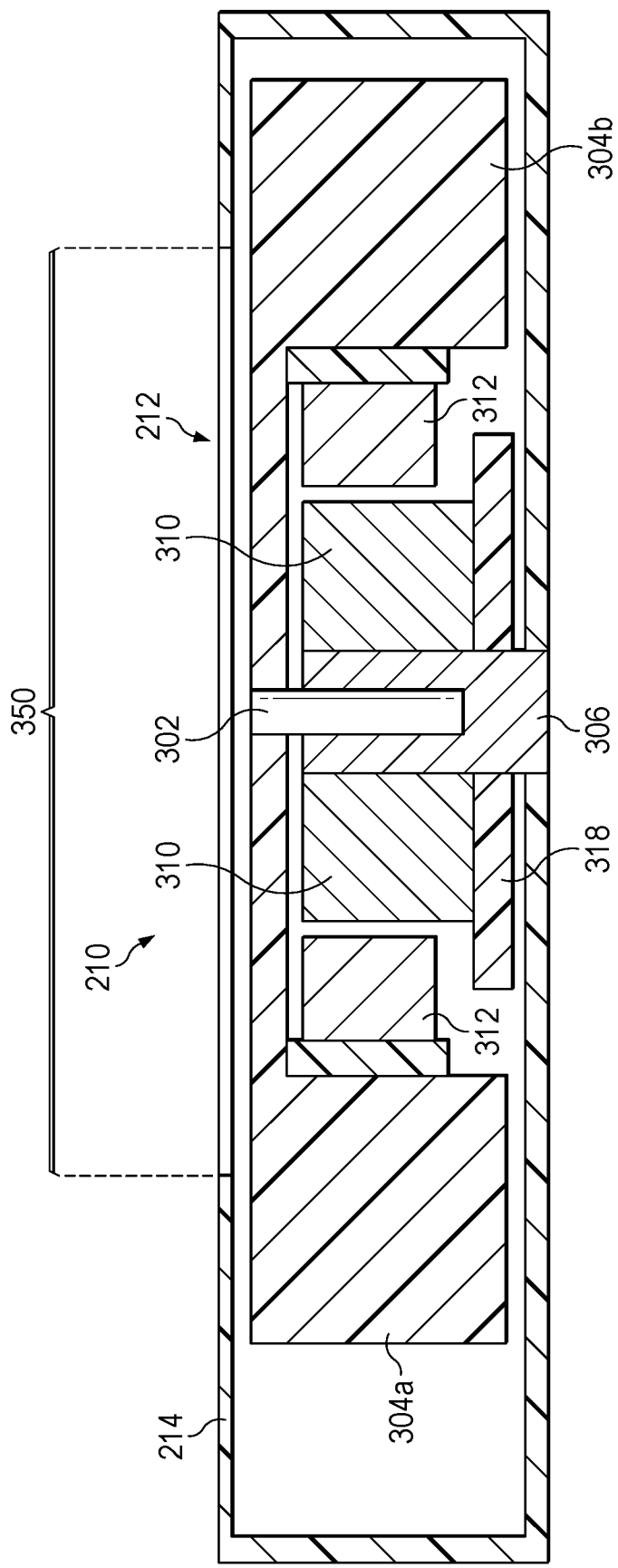
FIG. 3 illustrates a cutaway side view of the fan apparatus.

FIG. 3 is a cutaway side view of the fan 212 and the fan housing apparatus 214 (or fan housing 214). The fan 212 can include a shaft 302, a first fan blade 304a, a second fan blade 304b (collectively referred to as fan blades 304), a bearing 306, stators 310, magnets 312, and a control printed circuit board (PCB) 318. The fan housing apparatus 214 (or fan housing 214) can include an opening 350.

The bearing 306 surrounds the shaft 302. The bearing 306 can extend from the fan housing 214.

The stators 310 can substantially surround the bearing 306.

The fan blades 304 can be connected/coupled to the shaft 302. The first fan blade 304a can extend away from the shaft 302 in a first direction; and the second fan blade 304b can extend away from the shaft 302 in a second direction opposite to the first direction. In some examples, the fan blades 304 can be considered a single fan blade 304. In some examples, the first fan blade 304a and the second fan blade 304b are connected, forming a congruent fan blade. The fan blades 304 can rotate about the shaft 302.

The magnets 312 can be coupled to respective fan blades 304 and positioned adjacent to the stators 310. The magnets 312 can substantially surround the stators 310 and the bearing 306. The magnets 312 and the stators 310 facilitate rotation of the fan blades 304 with respect to the shaft 302 (e.g., clockwise rotation and/or counter-clockwise rotation).

The PCB 318 can provide control/management of the fan 214, and in particular, rotation of the fan blades 304.

In short, an air gap is maintained between the fan 212 and the fan housing 214 to account for several factors that could drive the fan blades 304 to come into contact with the fan housing 214—wobble of the fan blades 304, mechanical tolerance in dimensions of the fan blades 304, and fan housing 214 deformation. Such an air cap can create an air flow path for recirculation of air back to the fan 212.

Figure 4A:
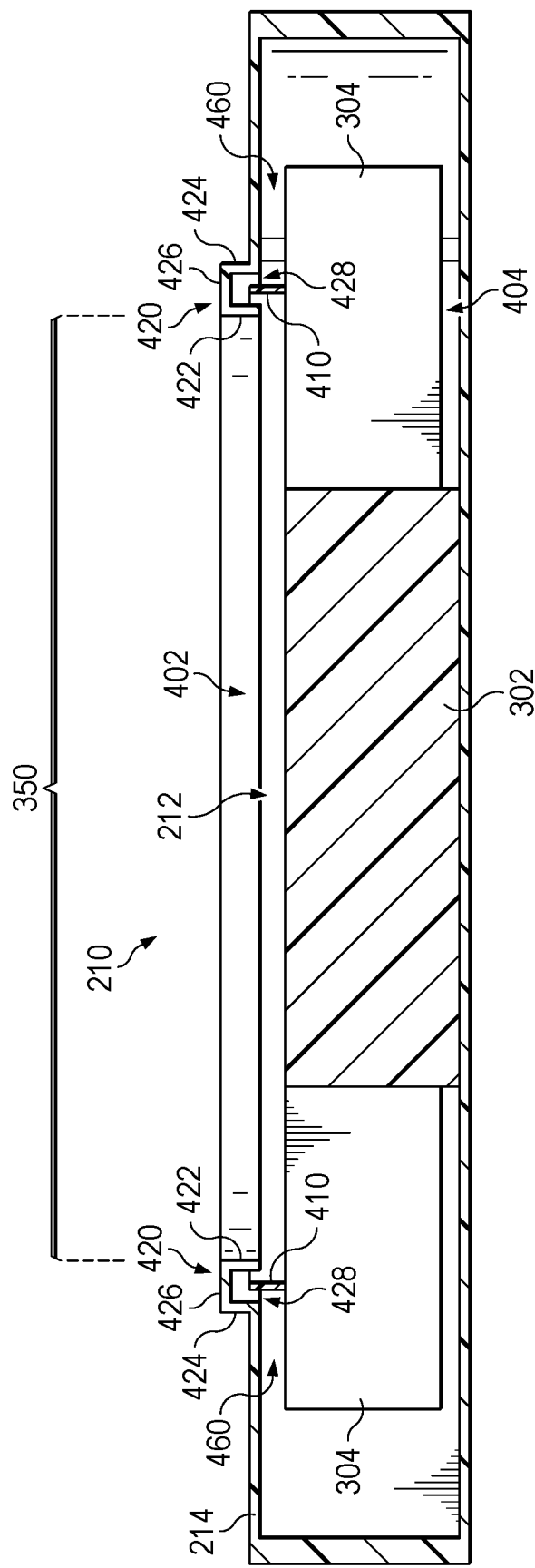
FIG. 4A illustrates a cutaway side view of the fan apparatus.
Figure 4B:
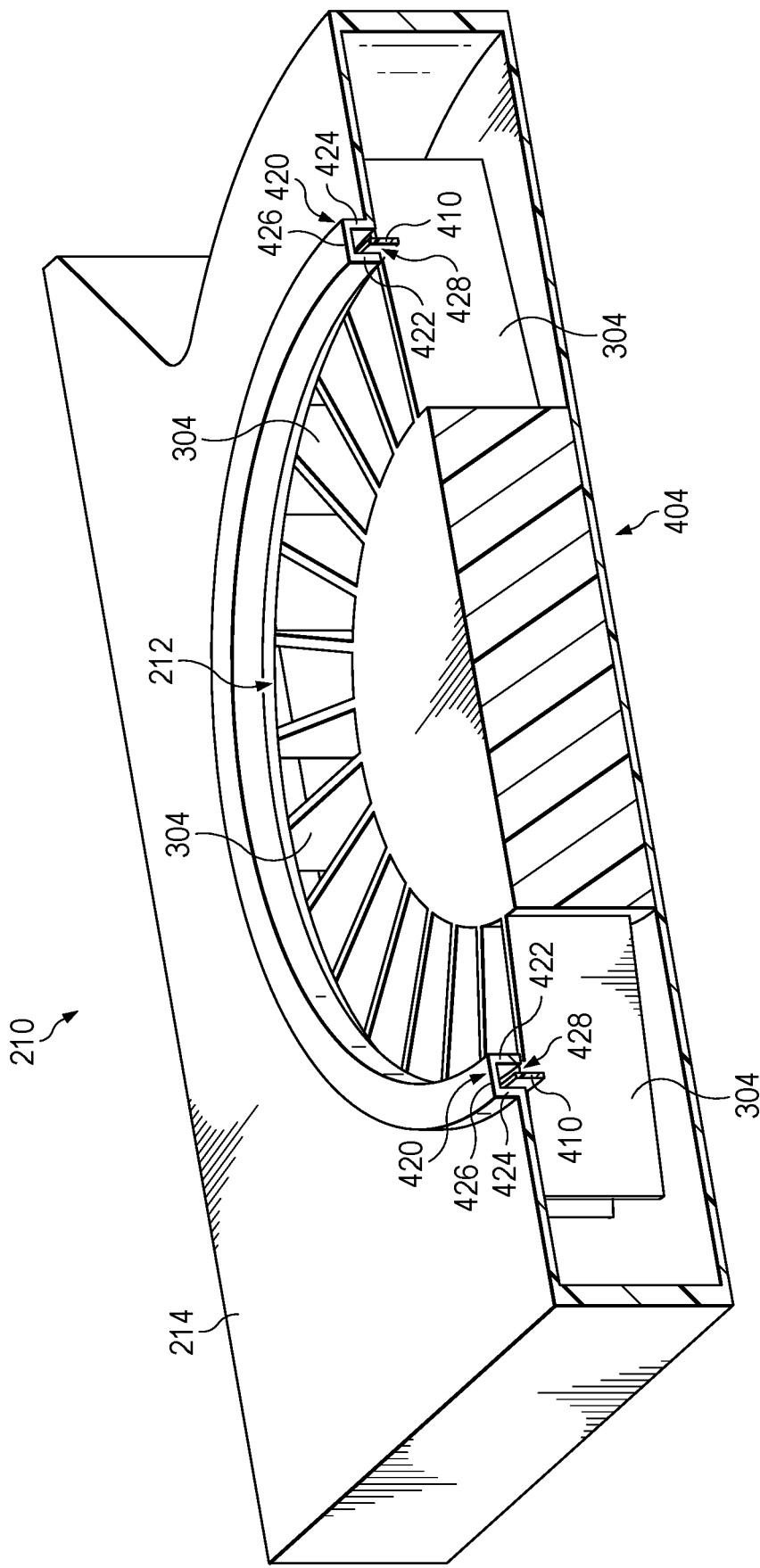
FIG. 4B illustrates a cutaway perspective view of the fan apparatus.

FIG. 4A illustrates a cutaway side view of a fan apparatus 210; and FIG. 4B illustrates a cutaway perspective view of the fan apparatus 210. Referring to FIGS. 4A, 4B; the fan 212 can include a first side 402 and a second side 404. The second side 404 is positioned opposite to the first side 402. The fan 212 can include the shaft 302, and the blades 304 coupled to the shaft 302. The fan 212 can further include a rib 410. In some examples, the rib 410 is coupled to each of the blades 304 at the first side 402 of the fan 212. In some examples, the rib 410 is coupled to a subset of the blades 304 at the first side 402 of the fan 212. In some examples, the rib 410 is circular.

The fan housing 214 includes the opening 350 and an emboss 420 surrounding the opening 350. The emboss 420 includes a first wall 422 spaced-part from a second wall 424. The emboss 420 can include a surface 426 positioned between the first wall 422 and the second wall 424. The first wall 422, the second wall 424, and the surface 426 define a recess 428 of the emboss 420. In some examples, the opening 350 is circular. In some examples, the emboss 420 is circular.

To that end, the fan 212 is coupled to the fan housing 214 with the first side 402 of the fan 212 in superimposition with the opening 350 of the fan housing 214. Furthermore, the fan 212 is coupled to the fan housing 214 with the first side 402 of the fan 212 in superimposition with the opening 350 of the fan housing 214 such that the rib 410 of the fan 212 is positioned within the emboss 420 of the fan housing 214. Specifically, at least a portion of the rib 410 of the fan 212 is positioned within the emboss 420 of the fan housing 214. In other words, at least a portion of the rib 410 of the fan 212 extends within the recess 428 of the emboss 420 of the fan housing 214.

To that end, positioning of the rib 410 of the fan 212 within the emboss 420 of the fan housing 214 reduces and/or minimizes air recirculation with an air gap 460 between the fan blades 304 and the fan housing 214. In other words, the rib 410 of the fan 212 positioned within the emboss 420 of the fan housing 214 acts or serves as an air dam to partially or wholly block, prevent, and/or minimize recirculation of air within the air gap 460 between the fan blades 304 and the fan housing 214.

For example, air that recirculated by the fan 212 to the air gap 460 encounters multiple inflection points to access of the first side 402 of the fan 212 and the fan blades 304. Specifically, the rib 410 positioned within the emboss 420 creates multiple 90 degree (or substantially 90 degree) "turns" for the path of air to travel from the gap 460 to the first side 402 of the fan 212. That is, the first wall 422, the second wall 424, and the surface 426 of the emboss 420, when the rib 410 is positioned within the emboss 420, creates four turns (four 90 degree turns) to provide restriction of air movement from the gap 460 to the first side 402 of the fan 212.

In some examples, the rib 410 is positioned within the emboss 420 such that the rib 410 is spaced-apart from the first wall 422 and the second wall 424. That is, the rib 410 is positioned between the first wall 422 and the second wall 424 and does not contact either of the first wall 422 and the second wall 424. Moreover, in some examples, the rib 410 is positioned within the emboss 420 such that the rib 410 is spaced-apart from the surface 426. That is, the rib 410 is positioned within the emboss 420 such that the rib 410 does not contact the surface 426. As a result of the rib 410 being spaced-apart from the first wall 422, the second wall 424, and the surface 426, clearance to account for wobbling of the fan 212, tolerance deviations of the fan 212, and POGO of the fan 212 is minimized and/or reduced.

Figure 5A:
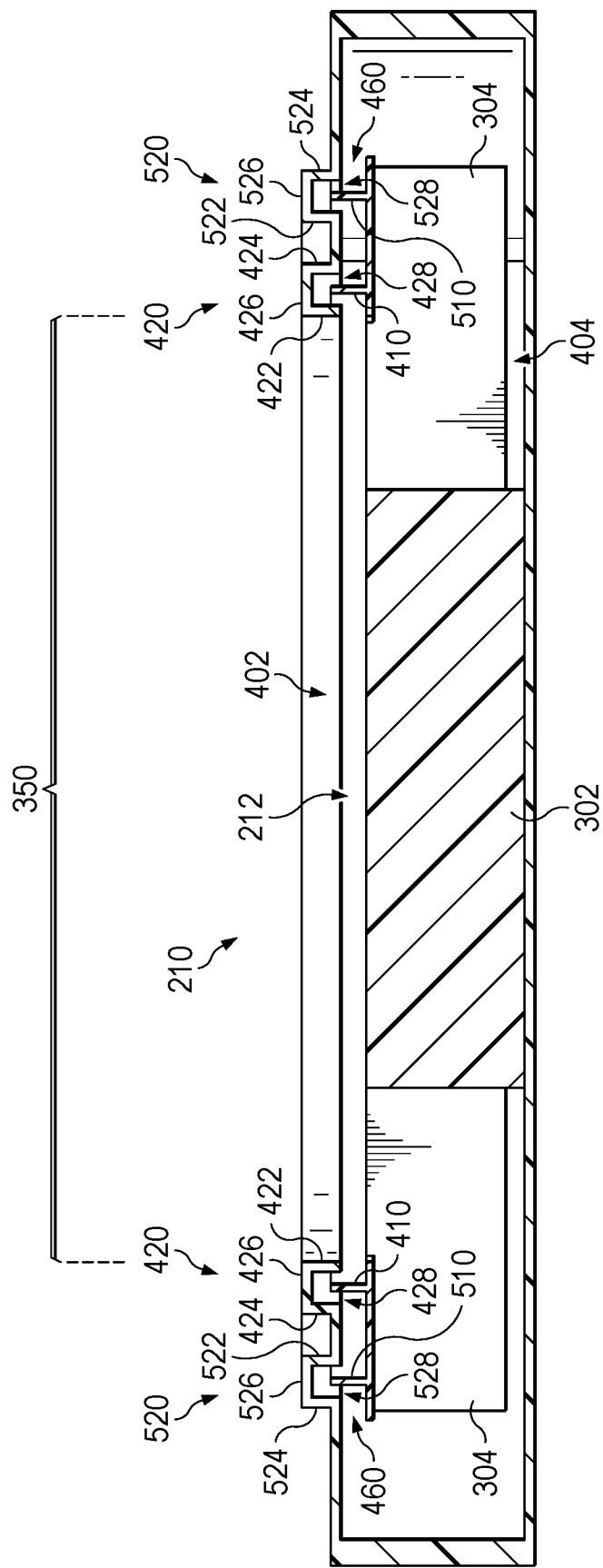
FIG. 5A illustrates a cutaway side view of the fan apparatus including multiple ribs and multiple embosses on a same side.
Figure 5B:
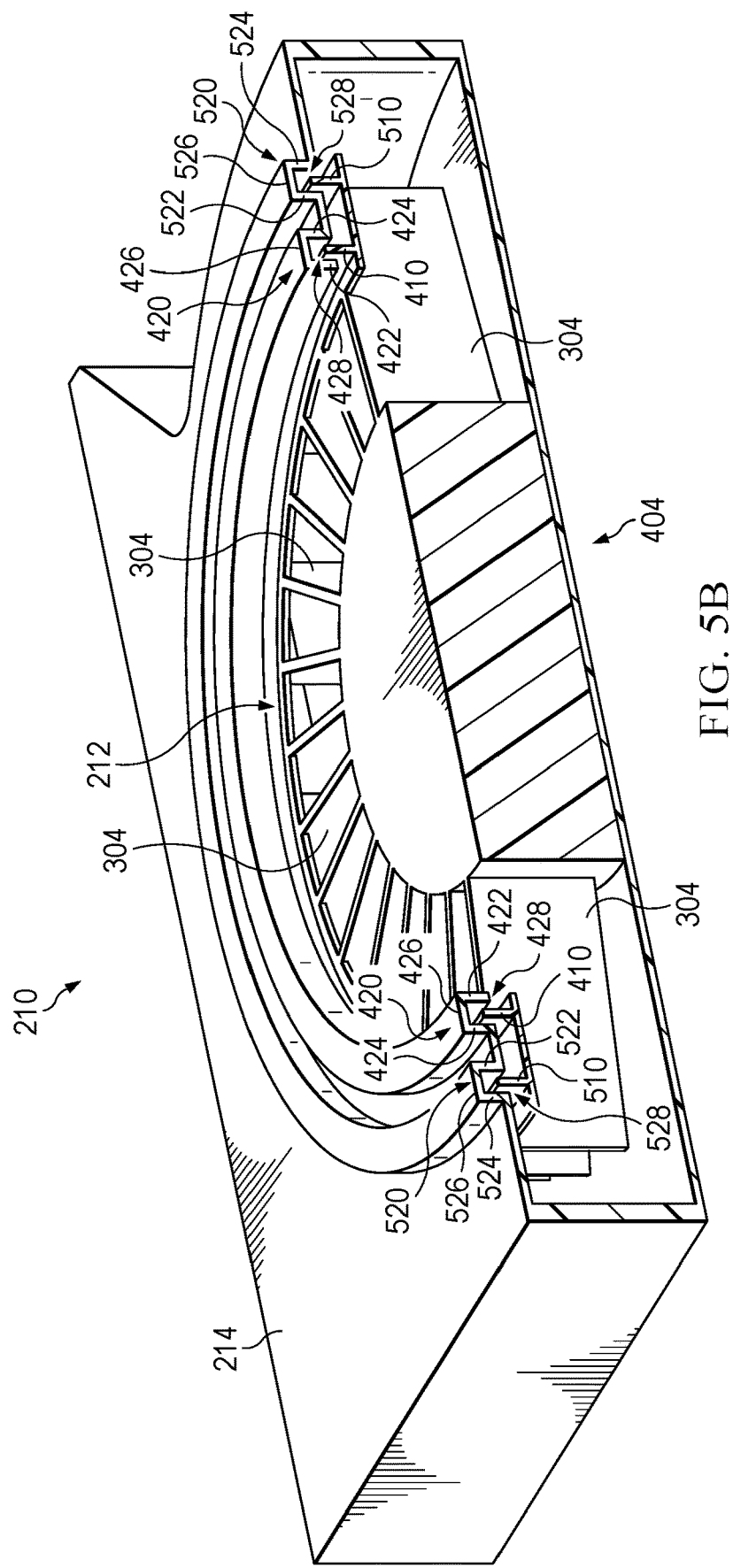
FIG. 5B illustrates a cutaway perspective view of the fan apparatus including multiple ribs and multiple embosses on a same side.

FIG. 5A illustrates a cutaway side view of the fan apparatus 210 including multiple ribs and multiple embosses on a same side; and FIG. 5B illustrates a cutaway perspective view of the fan apparatus 210 including multiple ribs and multiple embosses on a same side. Referring to FIGS. 5A, 5B, the fan 212 can further include an additional rib 510. The additional rib 510 is coupled to each of the blades 304 at the first side 402 of the fan 212. In some examples, the additional rib 510 is circular.

The fan housing 214 includes an additional emboss 520 surrounding the opening 350. The additional emboss 520 further surrounds the emboss 420. The additional emboss 520 includes a first wall 522 spaced-part from a second wall 524. The additional emboss 520 can include a surface 526 positioned between the first wall 522 and the second wall 524. The first wall 522, the second wall 524, and the surface 526 define a recess 528 of the additional emboss 520. In some examples, the additional emboss 520 is circular.

To that end, the fan 212 is coupled to the fan housing 214 with the first side 402 of the fan 212 in superimposition with the opening 350 of the fan housing 214. Furthermore, the fan 212 is coupled to the fan housing 214 with the first side 402 of the fan 212 in superimposition with the opening 350 of the fan housing 214 such that the additional rib 510 of the fan 212 is positioned within the additional emboss 520 of the fan housing 214. Specifically, at least a portion of the additional rib 510 of the fan 212 is positioned within the additional emboss 420 of the fan housing 214. In other words, at least a portion of the additional rib 510 of the fan 212 extends within the recess 528 of the additional emboss 520 of the fan housing 214.

To that end, positioning of the rib 410 of the fan 212 within the emboss 420 of the fan housing 214 and positioning of the additional rib 510 of the fan 212 within the additional emboss 520 of the fan housing 214 reduces and/or minimizes air recirculation with the air gap 460 between the fan blades 304 and the fan housing 214. In other words, the rib 410 of the fan 212 positioned within the emboss 420 of the fan housing 214 and the additional rib 510 of the fan 212 positioned within the additional emboss 520 of the fan housing 214 acts or serves as an air dam to partially or wholly block, prevent, and/or minimize recirculation of air within the air gap 460 between the fan blades 304 and the fan housing 214.

For example, air that is recirculated by the fan 212 to the air gap 460 encounters multiple inflection points to access of the first side 402 of the fan 212 and the fan blades 304. Specifically, the rib 410 is positioned within the emboss 420 and the additional rib 510 is positioned within the additional emboss 520 to create multiple 90 degree (or substantially 90 degree) "turns" for the path of air to travel from the gap 460 to the first side 402 of the fan 212. That is, the first wall 424, the second wall 424, and the surface 426 of the emboss 420, when the rib 410 is positioned within the emboss 420, creates four turns (90 degree turns) to provide restriction of air movement from the gap 460 to the first side 402 of the fan 212; and the first wall 524, the second wall 524, and the surface 526 of the additional emboss 520, when the additional rib 510 is positioned within the additional emboss 520, creates an additional four turns (90 degree turns) to provide restriction of air movement from the gap 460 to the first side 402 of the fan 212.

In some examples, the additional rib 510 is positioned within the additional emboss 520 such that the additional rib 510 is spaced-apart from the first wall 522 and the second wall 524. That is, the additional rib 510 is positioned between the first wall 522 and the second wall 524 and does not contact either of the first wall 522 and the second wall 524. Moreover, in some examples, the additional rib 510 is positioned within the additional emboss 520 such that the additional rib 510 is spaced-apart from the surface 526. That is, the additional rib 510 is positioned within the additional emboss 520 such that the additional rib 510 does not contact the surface 526. As a result of the additional rib 510 being spaced-apart from the first wall 522, the second wall 524, and the surface 526, clearance to account for wobbling of the fan 212, tolerance deviations of the fan 212, and POGO of the fan 212 is minimized and/or reduced.

Figure 6A:
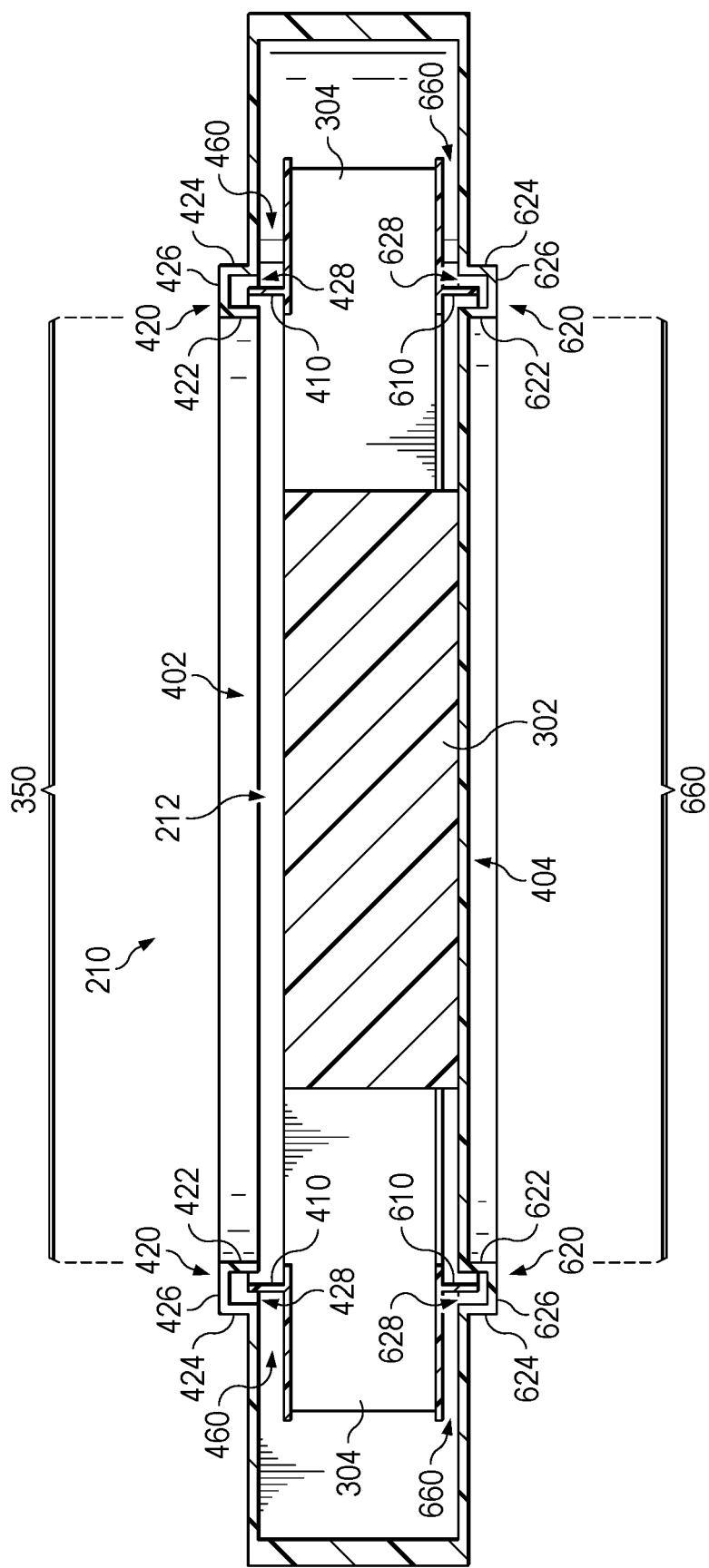
FIG. 6A illustrates a cutaway side view of the fan apparatus including multiple ribs and multiple embosses on opposite sides.
Figure 6B:
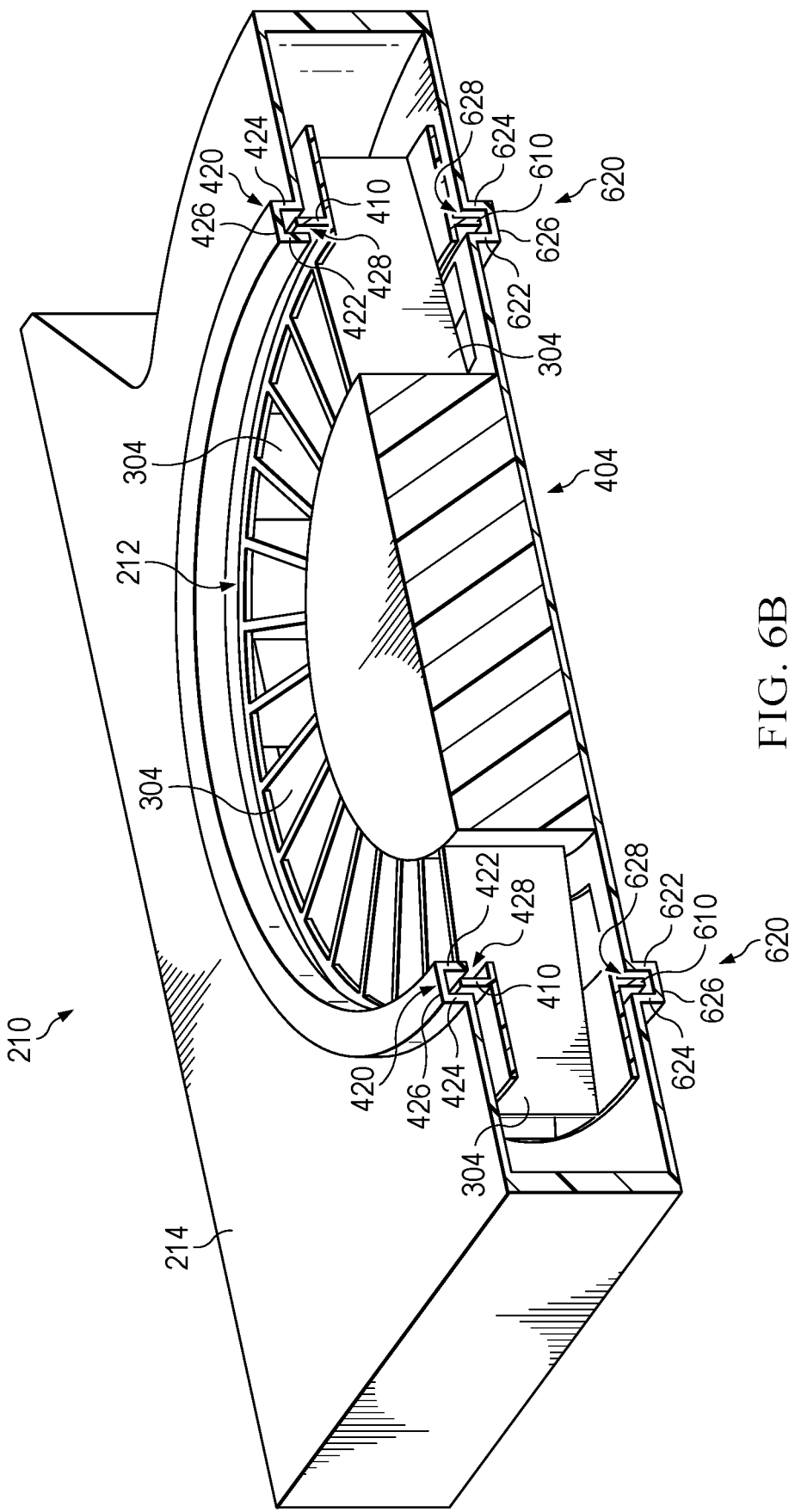
FIG. 6B illustrates a perspective view of the fan apparatus including multiple ribs and multiple embosses on opposite sides.

FIG. 6A illustrates a cutaway side view of the fan apparatus 210 including multiple ribs and multiple embosses on opposite sides; and FIG. 6B illustrates a perspective view of the fan apparatus 210 including multiple ribs and multiple embosses on opposite sides. Referring to FIGS. 6A, 6B, the fan 212 can further include an additional rib 610. The additional rib 610 is coupled to each of the blades 304 at the second side 404 of the fan 212. In some examples, the additional rib 610 is circular.

The fan housing 214 includes an additional opening 660 and an additional emboss 620 surrounding the additional opening 660. The additional emboss 620 includes a first wall 622 spaced-part from a second wall 624. The additional emboss 620 can include a surface 626 positioned between the first wall 622 and the second wall 624. The first wall 622, the second wall 624, and the surface 626 define a recess 628 of the additional emboss 620. In some examples, the additional emboss 620 is circular.

To that end, the fan 212 is coupled to the fan housing 214 with the first side 402 of the fan 212 in superimposition with the opening 360 of the fan housing 214 and the second side 404 of the fan 212 in superimposition with the additional opening 660 of the fan housing 214. Furthermore, the fan 212 is coupled to the fan housing 214 with the second side 404 of the fan 212 in superimposition with the additional opening 660 of the fan housing 214 of the fan housing 214 such that the additional rib 610 of the fan 212 is positioned within the additional emboss 620 of the fan housing 214. Specifically, at least a portion of the additional rib 610 of the fan 212 is positioned within the additional emboss 620 of the fan housing 214. In other words, at least a portion of the additional rib 610 of the fan 212 extends within the recess 628 of the additional emboss 620 of the fan housing 214.

To that end, positioning of the additional rib 610 of the fan 212 within the additional emboss 620 of the fan housing 214 reduces and/or minimizes air recirculation with an air gap 660 between the fan blades 304 and the fan housing 214. In other words, the additional rib 610 of the fan 212 positioned within the additional emboss 620 of the fan housing 214 acts or serves as an air dam to partially or wholly block, prevent, and/or minimize recirculation of air within the air gap 660 between the fan blades 304 and the fan housing 214.

For example, air that is recirculated by the fan 212 to the air gap 660 encounters multiple inflection points to access to the second side 404 of the fan 212 and the fan blades 304. Specifically, the additional rib 610 positioned within the additional emboss 620 creates multiple 90 degree (or substantially 90 degree) "turns" for the path of air to travel from the gap 660 to the second side 404 of the fan 212. That is, the first wall 624, the second wall 624, and the surface 626 of the additional emboss 620, when the additional rib 610 is positioned within the additional emboss 620, creates four turns (90 degree turns) to provide restriction of air movement from the gap 660 to the second side 404 of the fan 212.

In some examples, the additional rib 610 is positioned within the additional emboss 620 such that the additional rib 610 is spaced-apart from the first wall 622 and the second wall 624. That is, the additional rib 610 is positioned between the first wall 622 and the second wall 624 and does not contact either of the first wall 622 and the second wall 624. Moreover, in some examples, the additional rib 610 is positioned within the additional emboss 620 such that the additional rib 610 is spaced-apart from the surface 626. That is, the additional rib 610 is positioned within the additional emboss 620 such that the additional rib 610 does not contact the surface 626. As a result of the additional rib 610 being spaced-apart from the first wall 622, the second wall 624, and the surface 626, clearance to account for wobbling of the fan 212, tolerance deviations of the fan 212, and POGO of the fan 212 is minimized and/or reduced.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A fan apparatus for an information handling system, including:
    a fan having a first side and a second side, the second side positioned opposite to the first side, the fan including:
       a shaft;
       a plurality of blades coupled to the shaft; and
       a rib coupled to one or more of the plurality of blades at the first side of the fan;
    a fan housing, including:
       an opening; and
       an emboss surrounding the opening;
    wherein the fan is coupled to the fan housing with the first side of the fan in superimposition with the opening of the fan housing such that the rib of the fan is positioned within the emboss of the fan housing.

2. The fan apparatus of claim 1, wherein the opening is circular.

3. The fan apparatus of claim 2, wherein the emboss is circular.

4. The fan apparatus of claim 3, wherein the rib is circular.

5. The fan apparatus of claim 1, wherein the emboss includes a first wall spaced-apart from a second wall, wherein the rib is positioned within the emboss such that the rib is spaced-apart from the first wall and the second wall.

6. The fan apparatus of claim 5, wherein the emboss further includes a surface positioned between the first wall and the second wall, wherein the rib is positioned within the emboss such that the rib is spaced-apart from the surface.

7. The fan apparatus of claim 1, wherein
    the fan further includes an additional rib coupled to each of the plurality of blades at the first side of the fan,
    the fan housing further includes an additional emboss surrounding the opening,
    the fan is coupled to the fan housing with the first side of the fan in superimposition with the opening of the fan housing such that the additional rib of the fan is positioned within the additional emboss of the fan housing.

8. The fan apparatus of claim 7, wherein the emboss surrounds the additional emboss.

9. The fan apparatus of claim 1, wherein
    the fan further includes an additional rib coupled to each of the plurality of blades at the second side of the fan,
    the fan housing having a first side and a second side, the second side positioned opposite to the first side, the fan housing further including an additional opening positioned on the second side and an additional emboss surrounding the additional opening,
    the fan is coupled to the fan housing with the second side of the fan in superimposition with the additional opening of the fan housing such that the additional rib of the fan is positioned within the additional emboss of the fan housing.

10. The fan apparatus of claim 9, wherein the opening of the fan housing is positioned on the first side of the fan housing.

11. An information handling system, including:
a fan apparatus, including:
a fan having a first side and a second side, the second side positioned opposite to the first side, the fan including:
a shaft;
a plurality of blades coupled to the shaft; and
a rib coupled to one or more of the plurality of blades at the first side of the fan;
a fan housing, including:
an opening; and
an emboss surrounding the opening;
wherein the fan is coupled to the fan housing with the first side of the fan in superimposition with the opening of the fan housing such that the rib of the fan is positioned within the emboss of the fan housing.

12. The information handling system of claim 11, wherein the opening is circular.

13. The information handling system of claim 12, wherein the emboss is circular.

14. The information handling system of claim 13, wherein the rib is circular.

15. The information handling system of claim 11, wherein the emboss includes a first wall spaced-apart from a second wall, wherein the rib is positioned within the emboss such that the rib is spaced-apart from the first wall and the second wall.

16. The information handling system of claim 15, wherein the emboss further includes a surface positioned between the first wall and the second wall, wherein the rib is positioned within the emboss such that the rib is spaced-apart from the surface.

17. The information handling system of claim 11, wherein
the fan further includes an additional rib coupled to each of the plurality of blades at the first side of the fan,
the fan housing further includes an additional emboss surrounding the opening,
the fan is coupled to the fan housing with the first side of the fan in superimposition with the opening of the fan housing such that the additional rib of the fan is positioned within the additional emboss of the fan housing.

18. The information handling system of claim 17, wherein the emboss surrounds the additional emboss.

19. The information handling system of claim 11, wherein
the fan further includes an additional rib coupled to each of the plurality of blades at the second side of the fan,
the fan housing having a first side and a second side, the second side positioned opposite to the first side, the fan housing further including an additional opening positioned on the second side and an additional emboss surrounding the additional opening,
the fan is coupled to the fan housing with the second side of the fan in superimposition with the additional opening of the fan housing such that the additional rib of the fan is positioned within the additional emboss of the fan housing.

20. The information handling system of claim 19, wherein the opening of the fan housing is positioned on the first side of the fan housing.

* * * * *